United States Patent [19]
Appel

[11] Patent Number: 5,605,861
[45] Date of Patent: Feb. 25, 1997

[54] THIN POLYSILICON DOPING BY DIFFUSION FROM A DOPED SILICON DIOXIDE FILM

[75] Inventor: Andrew T. Appel, Dallas, Tex.

[73] Assignee: Texas Instruments Incorporated, Dallas, Tex.

[21] Appl. No.: 436,028

[22] Filed: May 5, 1995

[51] Int. Cl.$^6$ .................................................. H01L 21/225
[52] U.S. Cl. ............................................. 437/164; 437/34
[58] Field of Search .............................. 437/34, 41 RCM, 437/57, 160, 164; 148/DIG. 34

[56] References Cited

U.S. PATENT DOCUMENTS

| | | | |
|---|---|---|---|
| 4,345,366 | 8/1982 | Brower | 437/34 |
| 4,599,789 | 7/1986 | Gasner | 437/57 |
| 4,703,552 | 11/1987 | Baldi et al. | 437/57 |

*Primary Examiner*—Chandra Chaudhari
*Attorney, Agent, or Firm*—W. James Brady, III; Richard L. Donaldson

[57] ABSTRACT

A method of forming a CMOS transistor which comprises providing a partially fabricated CMOS structure having a p-type region wherein NMOS devices will be fabricated and an n-type region wherein PMOS devices will be fabricated, a separate pattern defining each region, a thin gate oxide layer in each window and a thin polysilicon gate layer having a thickness up to 3200 Å over the thin gate oxide layer having a thickness up to 90 Å. A layer of glass having a boron doping species therein, preferably borosilicate glass, is deposited over the polysilicon gate layer disposed over the the n-type region. The portion of the polysilicon gate layer disposed defining the p-type region is then doped n-type, preferably by implanting phosphorus, and the structure is heated to cause boron to diffuse from the layer of glass into the polysilicon gate layer over the n-type region. The layer of glass of glass is removed and fabrication of the CMOS device is then completed in standard manner.

12 Claims, 1 Drawing Sheet

THIN POLYSILICON DOPING BY DIFFUSION FROM A DOPED SILICON DIOXIDE FILM

BACKGROUND OF THE INVENTION

1. Field of the Invention

This invention relates to a method of doping the polysilicon gates of a CMOS device, specifically the PMOS gate, having thin gate oxide and gate regions.

2. Brief Description of the Prior Art

In the formation of semiconductor devices and primarily logic devices, dual work function polycrystalline silicon (polysilicon) is becoming increasingly common in CMOS processing for enhanced PMOS performance. A goal is to provide high performance CMOS devices wherein both the NMOS transistor and the PMOS transistor are surface channel with symmetric threshold voltages. In such devices, it is necessary that the polysilicon gate of the NMOS transistor be doped n-type and that the polysilicon gate of the PMOS transistor be doped p-type. It is known that, when a true metal is used for the gate material, there is an almost unlimited (relative to actual requirements) supply of free carriers and gate depletion is therefore not a problem. On the other hand, when heavily doped polysilicon is used as the gate material, it acts as a semi-metal but can present a depletion problem. Under a bias sufficient to invert the channel on the other side of the gate oxide, free electrons or holes (depending on conductivity type) will move away from the polysilicon/oxide interface, making the gate oxide electrically thicker than it is physically and decreasing the drive current. Accordingly, adequately doping the PMOS gates has been recognized by the industry to be a challenging problem. Boron is the only reasonable dopant for the task and boron presents several problems. B(11), the most common implanted boron species, has significant straggle into the polysilicon as-implanted, forcing use of a very low implant energy to prevent penetration of the end of the projected range through the gate oxide during boron implant. Switching to $BF_2$ as the dopant can provide a shallower implant and eliminate much of the straggle, however adding of fluorine in the polysilicon enhances boron penetration of the polysilicon gate during gate dopant activation.

Achieving uniform dopant distribution and activation in the P+ gates without having the boron penetrate the gate oxide is a serious problem. Low concentration at the polysilicon gate/gate oxide interface can lead to polysilicon depletion under channel inversion biasing, resulting in a thicker effective gate oxide and lower drive current. Boron penetration of the PMOS gate oxides results in unacceptable transition voltage ($V_t$) shifts and poor site to site transistor performance uniformity.

The industry has directed a great deal of attention to the above noted problems. Some approaches concentrate upon changing the polysilicon physical structure as discussed in "Improving gate oxide integrity in p+p MOSFET by using large grain size polysilicon gate", M. Koda et al., 1993 *IEDM Technical Digest*, page 471, or layering the gate electrode to reduce the boron diffusivity as discussed in "Suppression of Boron Penetration into an Ultra-Thin Gate Oxide by Using a Stacked-Amorphous-Silicon Film", S. Wu et al., 1993 *IEDM Technical Digest*, page 329. Others change the composition of the gate oxide to make it a better boron diffusion barrier as discussed in "A Boron-Retarding and High Interface Quality Thin Gate Dielectric for Deep-Submicron Devices", L. Manchanda et al., 1993 *IEDM Technical Digest*, page 459. All of the above described approaches either add process complexity or do not fully address the polysilicon depletion issue in the case of the Wu et al. reference.

A prior art process flow for doping thin layers of polysilicon on thin gate oxides has included the steps of (1) depositing the polysilicon, (2) coating the polysilicon with a resist, (3) exposing the resist, (4) developing the resist, (5) ion implanting phosphorus, (6) ashing the resist, (7) wet cleanup of the resist, (8) coating with resist, (9) exposing the resist, (10) developing the resist, (11) ion implanting boron, (12) ashing the resist, (13) wet cleanup of the resist, and (14) annealing the implant. This process flow requires fourteen major steps.

Phosphorous has not been such an issue at present and is therefore not included in the discussion of the problems addressed herein. However, as the polysilicon gate structure and gate oxide geometries become increasingly thinner, n+ polysilicon doping can become an issue as well.

SUMMARY OF THE INVENTION

In accordance with the present invention, the above noted problems of the prior art are minimized. To completely avoid the issue of implant damage and tailing, the polysilicon is doped by a solid source diffusion from a doped oxide film. Diffusion from doped oxides per se is known as discussed in "Sub-50 nm Gate Length n-MOSFETs with 10 nm Phosphorus Source/Drain Junctions, M. Ono, 1993 *IEDM Technical Digest*, page 119. However, the prior art has not appreciated the fact that dopant penetration of ultra-thin gate oxides in the range of up to about 90 Å can be avoided by this method. This usage appears to be best as a structure doping polysilicon layers less than about 3200 Å thick on gate oxides less than about 90 Å thick since the problems discussed above only appear to arise when a combination of thin gate oxide (from about 35 to about 90 Å) and thin polysilicon (up to about 3200 Å but generally about 1000 Å) are utilized.

Briefly, a thin polysilicon gate layer as defined above, disposed on a thin gate oxide as defined above, is doped by diffusing impurities into the polysilicon from a doped silicate glass over the polysilicon gate layer. Boro-phosphosilicate glass (BPSG) is commonly used in the semiconductor industry, deposition of boro-silicate glass (BSG) and phospho-silicate glass (PSG) seeing only trivial usage, though any of these glasses as well as others having, for example, germanium or fluorine can be used in accordance with the present invention, depending upon the impurity of interest. The dopant can be diffused from these doped glass films into adjacent films of polysilicon without having to worry about implant damage or implant straggle.

The amount of boron and phosphorus that can be incorporated into $SiO_2$ before the usually amorphous $SiO_2$ crystallizes is about eight percent for boron and about 10 percent for phosphorus. Since solids have about $10^{22}$ to about $10^{23}$ atoms/cm$^3$, a 5 percent film would have about $5\times10^{20}$ to about $5\times10^{21}$ boron atoms/cm$^3$. The anneal temperature solid solubility (about 850° C.) for boron on silicon is about $10^{20}$ atoms/cm$^3$. The diffusion from BSG into the polysilicon depends upon the net dopant gradient (how much more boron is on one side of the BSG/polysilicon interface) and will tend to slow down over time as the polysilicon becomes doped and the BSG becomes depleted. The diffusion also depends upon the segregation coefficient (the tendency for a dopant to accumulate on one side of an interface or the other), the diffusivity on polysilicon which is primarily dependent upon temperature but also dependent upon the polysilicon microstructure. Time at temperature is also a factor, but can be easily controlled. It is important that at some time, the temperature be high enough to activate the dopant (forcing the dopant into substitutional lattice sites rather than interstitial sites), however it can be assumed that this will take place during the source/drain anneal step.

A specific process flow is to dope a polysilicon gate layer p+ with boron in a dual work function CMOS process flow without the boron penetrating the gate oxide.

A process flow includes depositing a blanket layer of doped silicon dioxide glass (BSG, for example) on the polysilicon gate layer before patterning and etching the gates. A resist pattern is exposed to remove resist over the NMOS areas where the BSG is removed from the NMOS gate area. The same pattern is used to mask the PMOS gates from the NMOS gate phosphorus pattern. After an n+ implant, preferably phosphorus, into the polysilicon NMOS regions, the resist pattern is stripped and the wafer is annealed to activate and distribute the n+ polysilicon dopant in the NMOS gates and drive boron from the BSG into the PMOS polysilicon gate layer. The remaining BSG is then wet stripped from the wafer and the wafer is ready for gate patterning and etching. Processing then continues to completion of the CMOS device as in the prior art by formation of source/drain regions followed by appropriate metallization.

The preferred process flow in accordance with the present invention after formation of the gate oxide, with all process steps to that point in the process flow being standard, requires the major steps of (1) depositing the polysilicon over the gate oxide, (2) depositing BSG over the polysilicon, (3) coating the BSG with a resist, (4) exposing the resist, (5) developing the resist, (6) etching the BSG, (7) ion implanting phosphorus, (8) ashing the resist, (9) wet cleanup of the resist, (10) annealing the implant, and (11) HF dip to remove the BSG. It can be seen that only eleven major steps are required as opposed to fourteen in the prior art for this portion of the process flow.

Alternately, the gates can be patterned and etched with only n+ doping and then the blanket BSG deposited. The NMOS lightly doped drain (LDD) is then patterned and the BSG either etched or left as the implant screen oxide (with the possibility of having boron "knocked-on" during the phosphorus implant, i.e., any impurity in the silicon colliding with incident ions and becoming dislodged and forced further into the silicon, boron, being light, having a better chance of getting "knocked on" by phosphorus which is heavier rather than the reverse taking place). After stripping the pattern, the N-LDD is annealed (this operates best in an arsenic N-LDD flow) and the PMOS polysilicon gate is doped p+. After anneal, the BSG is etched back, leaving narrow sidewalls on the gate polysilicon. P-LDDs are then patterned-and-implanted with the BSG sidewall serving as a compensating oxide to provide comparable $L_{eff}$ (gate length less the overlap of both source/drains under the gate) for the NMOS and PMOS devices, even with the higher diffusivity of boron as compared to arsenic. Full sidewalls are then deposited and processing continues as in the prior art. An advantage of this flow is two dimensional doping of the p+ polysilicon (diffusion from top and sides).

The process described above operates equally well for doping n+ polysilicon from PSG. As demonstrated below, the combination ion implant, solid source diffusion process represents a significant process simplification from the double implant process currently in use.

DESCRIPTION OF THE PREFERRED EMBODIMENT

Figure 1:
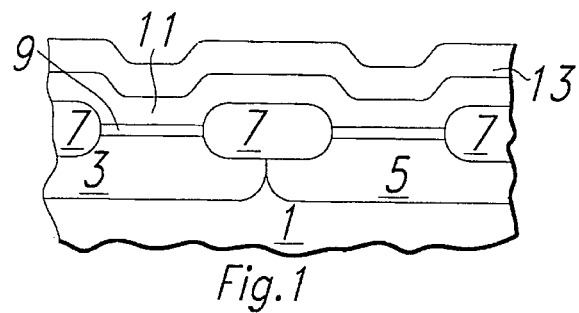
FIGS. 1 to 5 are a process flow in accordance with a preferred embodiment of the present invention.

Referring now to FIGS. 1 to 5, there is shown a process flow in accordance with the present invention. FIG. 1 shows a partially fabricated CMOS device which has thus far been fabricated in accordance with standard techniques. The device includes a lightly doped epitaxial layer on a heavily doped silicon substrate 1 having a PWELL 3 and an NWELL 5 therein. A field oxide (FOX) 7 provides a window to both the PWELL 3 and the NWELL 5 with a thin gate oxide 9 having a thickness of 60 Å disposed across each window. A layer of polysilicon 11 is disposed over the field oxide 7 and the gate oxide 9. A layer of boro-silicate glass or boron-doped silicon dioxide (BSG) 13 is deposited over the polysilicon 11.

Figure 2:
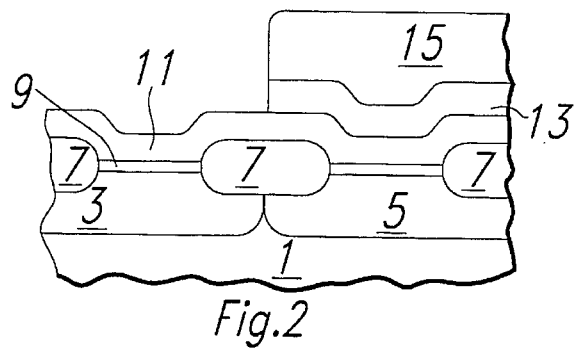
Figure 3:
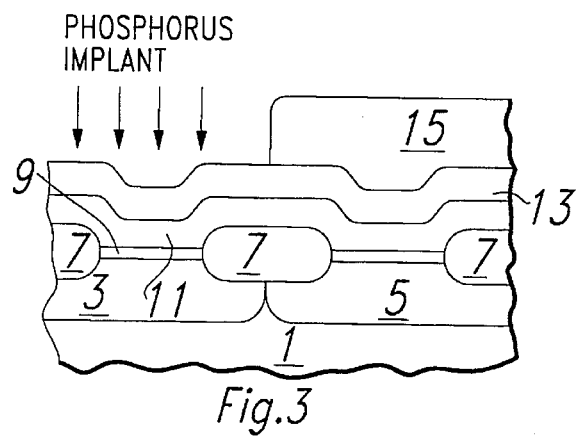
Figure 4:
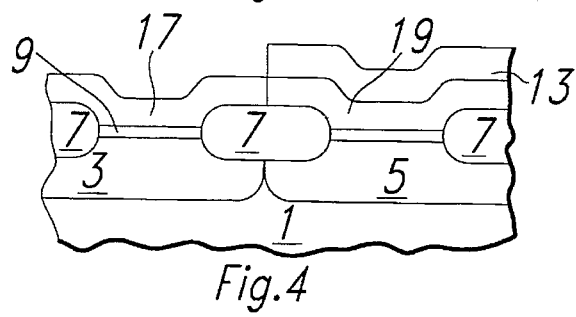
Figure 5:
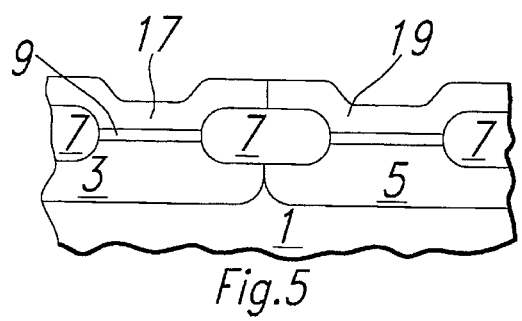

Referring now to FIG. 2, the region above the NWELL 5 wherein the PMOS transistor is being fabricated is masked with a photoresist 15 in standard manner to expose the BSG 13 above the PWELL 3. The BSG 13 above the PWELL 3 is then etched away, leaving the photoresist 15 and the BSG over the NWELL 5 as shown in FIG. 3. Phosphorus is then implanted into the exposed polysilicon 11 over the PWELL 3 as also shown in FIG. 3. The remaining photoresist 15 is then removed and the boron in the BSG 13 then diffuses from the BSG into the polysilicon gate portion over the NWELL 5 either by furnace or rapid thermal anneal at 850° C. to dope that polysilicon gate portion p+ whereas the polysilicon gate portion over the PWELL 3 is now doped n+ as shown in FIG. 4. The remaining BSG 13 is then removed to provide a PWELL 3 with an n+ polysilicon gate 17 thereover and an NWELL 5 with a p+ polysilicon gate 19 thereover as shown in FIG. 5. Processing then continues in standard manner to provide source and drain regions in each of the wells 3 and 5 with metallization following.

A process flow is as follows: a blanket layer of doped silicon dioxide glass (BSG, for example) is deposited on the gate polysilicon before patterning and etching the gates. The PWELL reticle is used to pattern the wafer and the BSG is removed from the NMOS gate area. The same pattern is used to mask the PMOS gates from the NMOS gate phosphorus pattern. After an n+ implant into the polysilicon, the resist pattern is stripped and the wafer is annealed to activate and distribute the n+ polysilicon dopant and drive boron from the BSG into the p+ polysilicon. The BSG is then wet stripped from the wafer and the wafer is ready for gate pattern and etch. Processing then continues to completion of the CMOS device as in the prior art.

A process flow in accordance with the present invention requires the steps of (1) depositing the polysilicon, (2) depositing BSG over the polysilicon, (3) coating the BSG with a resist, (4) exposing the resist, (5) developing the resist, (6) etching the BSG, (7) ion implanting phosphorus, (8) ashing the resist, (9) wet cleanup of the resist, (10) annealing the implant, and (11) HF dip to remove the BSG. It can be seen that only eleven major steps are required as opposed to fourteen in the prior art.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. A method of forming a CMOS transistor comprising the steps of:
    (a) providing a partially fabricated CMOS structure having a p-type region and an n-type region, a separate window to each of said p-type and n-type regions, a gate oxide layer having a finite thickness less than 90 Å over each said window and a polysilicon gate layer having a finite thickness less than 3200 Å over said gate oxide layer;
    (b) depositing a layer of glass having a boron doping species therein over said polysilicon gate layer disposed over said window over said n-type region;
    (c) then doping the portion of said polysilicon gate layer disposed over said window over said p-type region n-type;
    (d) heating the structure formed in step (c) to cause boron to diffuse from said layer of glass into said polysilicon gate layer disposed over said window over said n-type region;
    (e) removing said layer of glass; and
    (f) completing fabrication of said CMOS device.

2. The method of claim 1 wherein said glass is borosilicate glass.

3. The method of claim 1 wherein said n-type dopant is phosphorus.

4. The method of claim 2 wherein said n-type dopant is phosphorus.

5. The method of claim 1 wherein said step of depositing a layer of glass having a boron doping species therein over said polysilicon gate layer disposed over said window over said n-type region includes the steps of depositing a layer of glass having a boron doping species therein over said polysilicon gate layer and removing the portion of said layer of glass over said p-type region.

6. The method of claim 2 wherein said step of depositing a layer of glass having a boron doping species therein over said polysilicon gate layer disposed over said window over said n-type region includes the steps of depositing a layer of glass having a boron doping species therein over said polysilicon gate layer and removing the portion of said layer of glass over said p-type region.

7. The method of claim 3 wherein said step of depositing a layer of glass having a boron doping species therein over said polysilicon gate layer disposed over said window over said n-type region includes the steps of depositing a layer of glass having a boron doping species therein over said polysilicon gate layer and removing the portion of said layer of glass over said p-type region.

8. The method of claim 4 wherein said step of depositing a layer of glass having a boron doping species therein over said polysilicon gate layer disposed over said window over said n-type region includes the steps of depositing a layer of glass having a boron doping species therein over said polysilicon gate layer and removing the portion of said layer of glass over said p-type region.

9. The method of claim 5 wherein said step of removing said portion of said layer of glass over said p-type region includes the steps of masking said layer of glass and patterning the mask to expose said glass over said p-type region while continuing to mask said glass over said n-type region and then removing said portion of said layer of glass over said p-type region.

10. The method of claim 6 wherein said step of removing said portion of said layer of glass over said p-type region includes the steps of masking said layer of glass and patterning the mask to expose said glass over said p-type region while continuing to mask said glass over said n-type region and then removing said portion of said layer of glass over said p-type region.

11. The method of claim 7 wherein said step of removing said portion of said layer of glass over said p-type region includes the steps of masking said layer of glass and patterning the mask to expose said glass over said p-type region while continuing to mask said glass over said n-type region and then removing said portion of said layer of glass over said p-type region.

12. The method of claim 8 wherein said step of removing said portion of said layer of glass over said p-type region includes the steps of masking said layer of glass and patterning the mask to expose said glass over said p-type region while continuing to mask said glass over said n-type region and then removing said portion of said layer of glass over said p-type region.

* * * * *